United States Patent [19]
Tezuka et al.

[11] Patent Number: 5,923,046
[45] Date of Patent: Jul. 13, 1999

[54] QUANTUM DOT MEMORY CELL

[75] Inventors: Tsutomu Tezuka, Yokohama; Atsushi Kurobe, Yamato, both of Japan

[73] Assignee: Kabushiki Kaisha Toshiba, Kawasaki, Japan

[21] Appl. No.: 08/922,377

[22] Filed: Sep. 3, 1997

[30] Foreign Application Priority Data

Sep. 13, 1996 [JP] Japan .................................. 8-242784
Aug. 5, 1997 [JP] Japan .................................. 9-210548

[51] Int. Cl.[6] .......................... H01L 29/06; H01L 29/16; H01L 29/788
[52] U.S. Cl. .............................. 257/24; 257/14; 257/316; 257/321; 257/20; 257/17; 365/185.01
[58] Field of Search .................................. 257/9, 14, 17, 257/20, 24, 316, 321; 365/185.01

[56] References Cited

U.S. PATENT DOCUMENTS

| 5,362,973 | 11/1994 | Paoli et al. ................................. | 257/14 |
| 5,600,163 | 2/1997 | Yano et al. ................................ | 257/314 |
| 5,670,790 | 9/1997 | Katoh et al. .............................. | 257/14 |
| 5,679,962 | 10/1997 | Kizuki ....................................... | 257/17 |
| 5,714,766 | 2/1998 | Chen et al. ............................... | 257/17 |

FOREIGN PATENT DOCUMENTS 7-326730  12/1995  Japan .

OTHER PUBLICATIONS

Guo, et al., "Single–Electron MOS Memory with Nanoscale Floating–Gate and Narrow Channel," IEDM–1996, pp. 955–956.

Nakajima, et al., "Room Temperature Operation of Si Single–Electron Memory with Self–Aligned Floating Dot Gate," IEDM–1996, pp. 952–953.

K. Yano, et al., "Room–Temperature Single–Electron Memory", IEEE Transactions on Electron Devices, vol. 41, No. 9, Sep. 1994, pp. 1628–1637.

S. Tiwari, et al., "A Silicon Nanocrystals Based Memory", Appl. Phys. Lett., vol. 68, No. 10, Mar. 4, 1996, pp. 1377–1379.

*Primary Examiner*—John Guay
*Attorney, Agent, or Firm*—Oblon, Spivak, McClelland, Maier & Neustadt, P.C.

[57] ABSTRACT

A channel layer and a spacer layer form a heterojunction therebetween. A V-shaped groove is formed in the spacer layer. The sharp bottom of the V-shaped is located above the heterojunction interface. On the bottom of the V-shaped groove a plurality of quantum dots are formed in a line and discretely. A gate electrode is formed above the quantum dots. A source electrode is connected to the heterojunction interface to form an ohmic contact therebetween. A drain electrode is connected to the heterojunction interface to form an ohmic contact therebetween. The quantum dots are arranged between the source and drain electrodes.

5 Claims, 15 Drawing Sheets

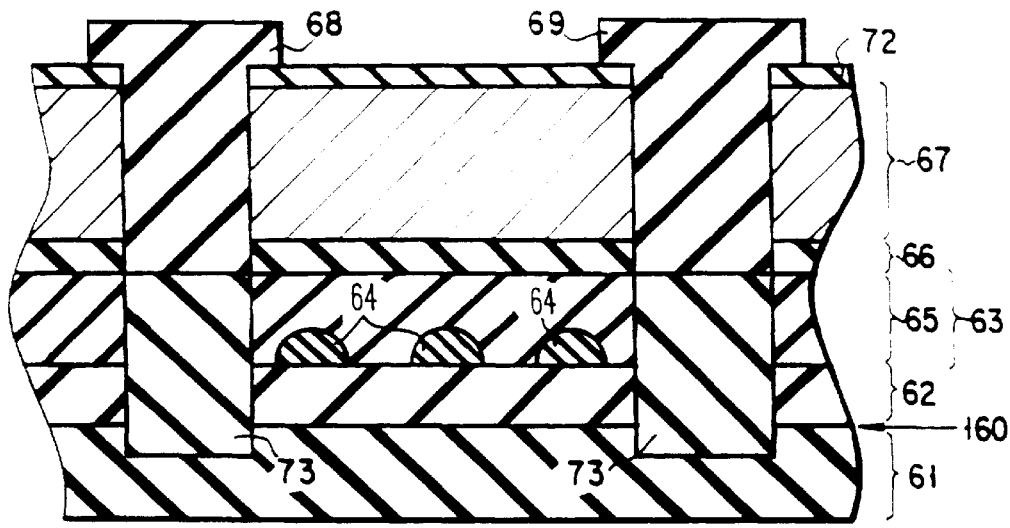
F I G. 34
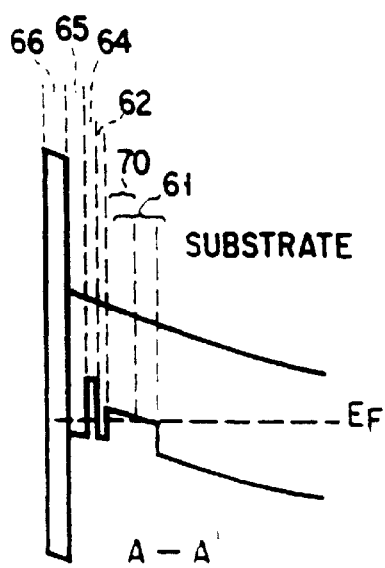
F I G. 35
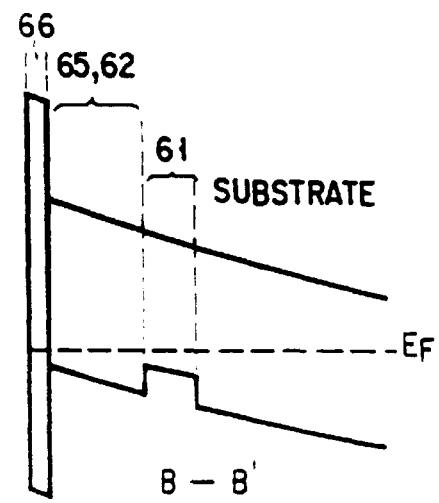
F I G. 36
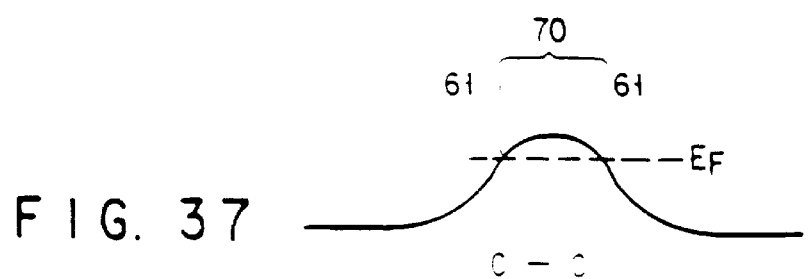
F I G. 37

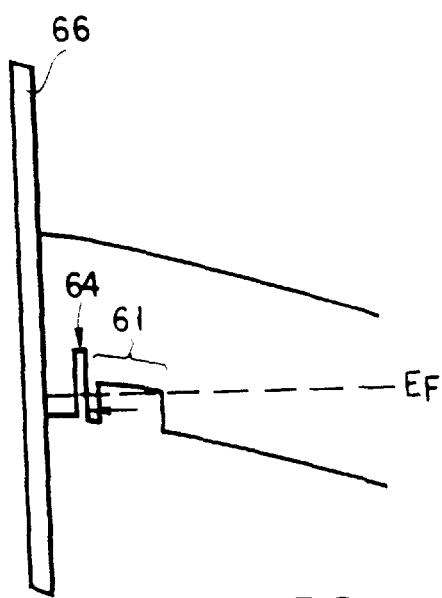
F I G. 38
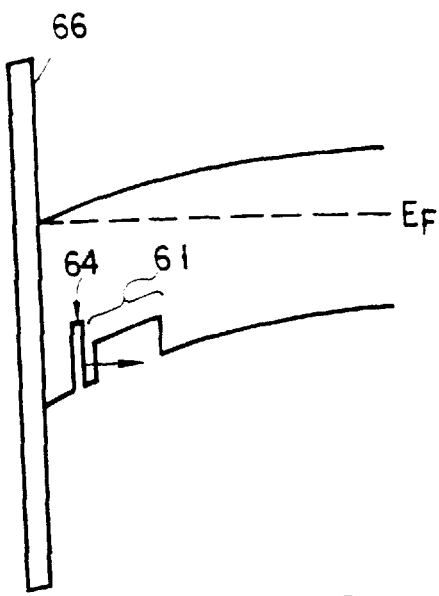
F I G. 39
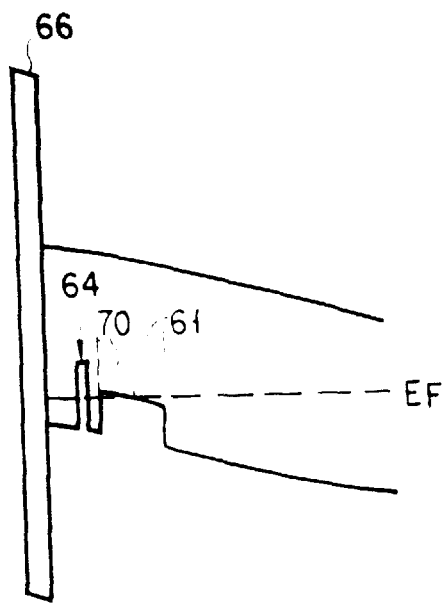
F I G. 40
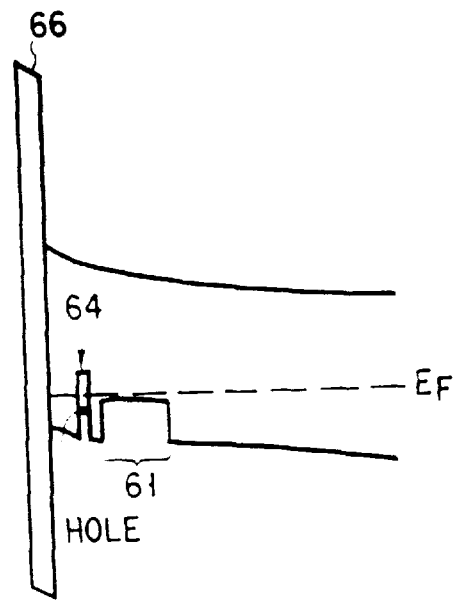
F I G. 41

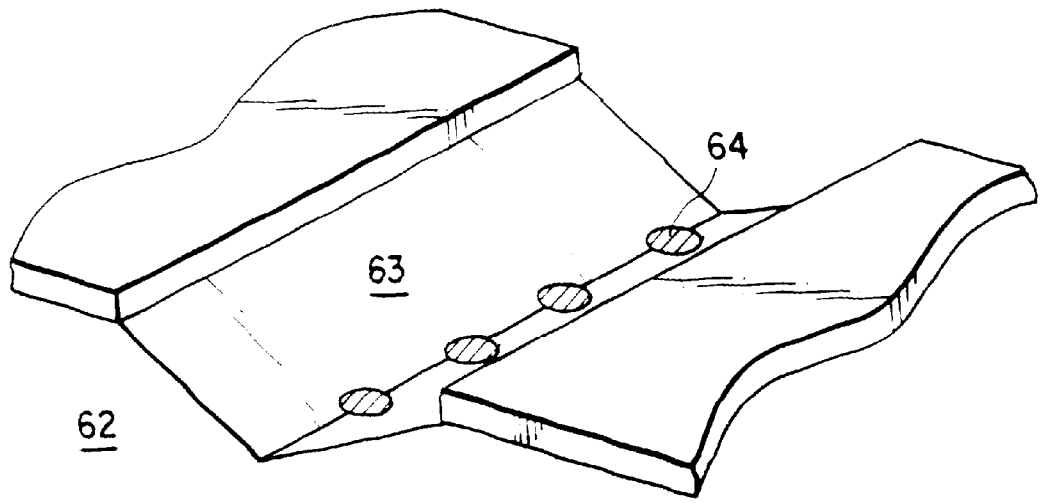
F I G. 48
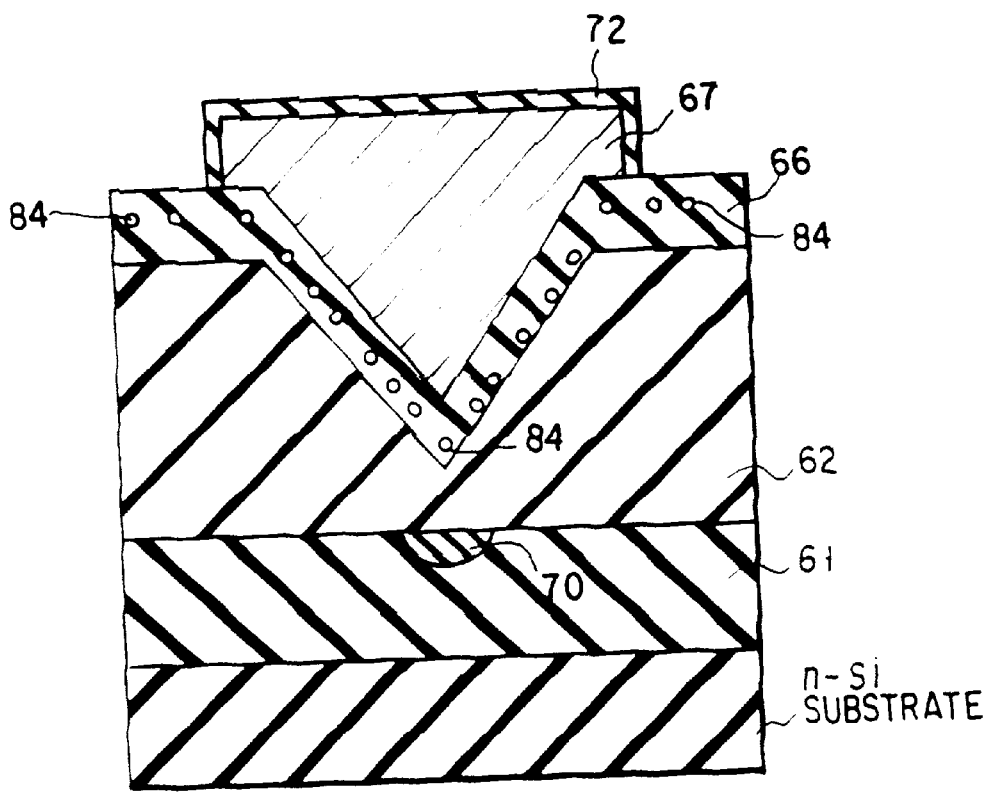
F I G. 49

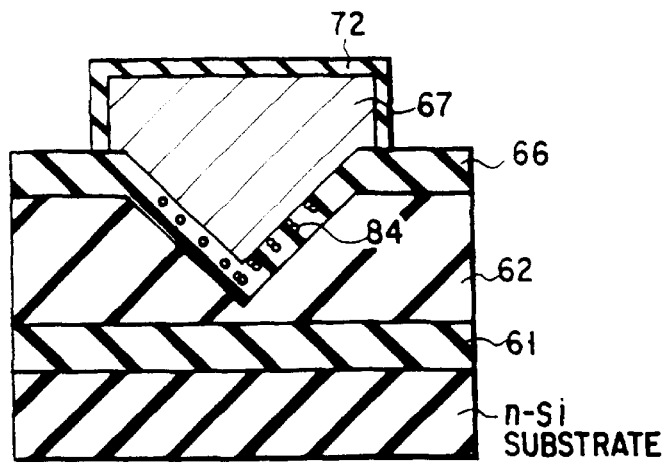
FIG. 50
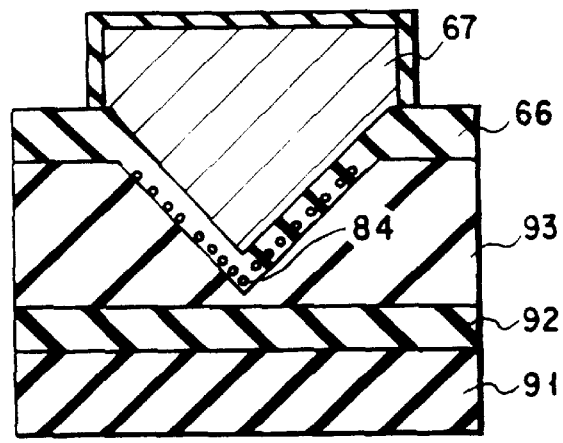
FIG. 51
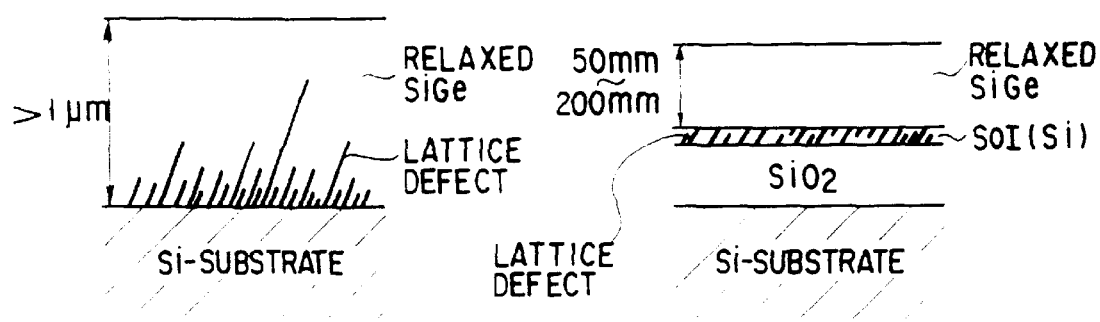
FIG. 52
FIG. 53

QUANTUM DOT MEMORY CELL

BACKGROUND OF THE INVENTION

The present invention relates to a memory cell that is a constituent element of a semiconductor memory cell array, and more specifically to a structure thereof.

There is little room for further improvements in packing density, capacity and power dissipation of semiconductor memory cell arrays by scaling down the dimensions of memory cells of conventional structures. To overcome this, the advent of memory cells having novel structures and operating principles has been expected. One of such memory cells is a quantum dot memory cell.

FIG. 1 shows the structure of a quantum dot memory cells (K. Yano et al., IEEE Trans. Electron Devices, 41, 1628, 1994). When a negative bias is applied to a polysilicon thin film, electrons are transferred from the gate to the domain and stored in the domain. Thus, the domain becomes negatively charged. The resulting Coulomb's repulsive force narrows the current channel in the polysilicon, thereby reducing the conductance of the channel.

The stored electrons are returned from the domain to the gate by applying a positive bias to the polysilicon thin film. Thus, the current channel is restored to its original conductance. Sensing changes in the conductance of the current channel allows discrimination between "0" and "1" states of the cell.

On the left-hand side of FIG. 1 are shown applied voltages for placing the memory cell (1) in the "1" state and the memory cell (2) in the "0" state with the word line (WL1) selected. On the right-hand side of FIG. 1 are shown readout currents from two cells that share a word line.

FIG. 2 shows the structure of a memory cell fabricated by Tiwari et al. in IBM (S. Tiwari et al., Appl. Phys. Lett., 68, 1377, 1996). This cell is characterized in that silicon microcrystals, called nano-crystals, are buried in the gate oxide of a general MOS transistor.

When a high potential is applied to the gate, electrons are transferred from the channel formed below the silicon-silicon oxide interface to the silicon microcrystals through the tunnel oxide and stored in the microcrystals.

When electrons are stored in the silicon microcrystals, the threshold of the MOS transistor shifts, allowing discrimination between the two states of the cell.

In the cell structure of FIG. 1, electrons are stored in the grains of the polysilicon thin film. However, difficulties are involved in making the grains uniform in size. In addition, it is difficult to control the position of the grains. Poor precision in the size and position of the grains will make readout current vary widely from memory cell to memory cell. As a result, readout errors become easy to occur. This problem will be solved by providing multiple grains for one cell and combining currents from the grains into one readout current to thereby checking variations in readout current. However, this method will increase the area of a memory cell, failing to meet high packing density and low power dissipation requirements of semiconductor memory arrays.

In the technique of FIG. 2, the narrowing of the channel based on the Coulomb's repulsive force and hence a reduction in channel conduction cannot be expected much because the channel is relatively wide. In addition, the silicon micro-crystals are not controlled with respect to their arrangement and are distributed randomly over the channel. Thus, scaling down of the dimensions of the cell will make the characteristics vary widely from cell to cell. For this reason, difficulties are involved in increasing the packing density and reducing the power dissipation.

BRIEF SUMMARY OF THE INVENTION

It is an object of the present invention to provide a semiconductor memory cell which permits variations in readout current from cell to cell to be reduced and permits a change in channel conductance to be increased to thereby adapt itself to high packing density and low power dissipation requirements of semiconductor memory cell arrays.

According to an aspect of the present invention there is provided a memory cell comprising: a channel layer of a first semiconductor; a spacer layer formed on the channel layer, the spacer layer consisting of a second semiconductor that is dissimilar to the first semiconductor to form a heterojunction interface therebetween; a V-shaped groove formed in the spacer layer, the bottom of the V-shaped groove being located above the heterojunction interface between the channel layer and the spacer layer; a plurality of quantum dots arranged discretely on the bottom of the V-shaped groove; a gate electrode formed above the quantum dots; a source electrode connected to the heterojunction interface to form an ohmic contact therebetween; and a drain electrode connected to the heterojunction interface to form an ohmic contact therebetween, the drain electrode being spaced away from the source electrode so that the quantum dots are arranged therebetween.

According to another aspect of the present invention there is provided a memory cell comprising: a channel layer of a first semiconductor; a spacer layer formed on the channel layer, the spacer layer consisting of a second semiconductor that is dissimilar to the first semiconductor to form a heterojunction interface therebetween; a V-shaped groove formed in the spacer layer, the bottom of the V-shaped groove being located above the heterojunction interface between the channel layer and the spacer layer; a gate oxide formed in the V-shaped groove; a plurality of quantum dots buried in the gate oxide; a gate electrode formed on the gate oxide; a source electrode connected to the heterojunction interface to form an ohmic contact therebetween; and a drain electrode connected to the heterojunction interface to form an ohmic contact therebetween, the drain electrode being spaced away from the source electrode so that the quantum dots are arranged therebetween.

According to still another aspect of the present invention, there is provided a memory cell comprising: a channel layer of a first semiconductor; a spacer layer formed on the channel layer, the spacer layer consisting of a second semiconductor that is dissimilar to the first semiconductor to form a heterojunction interface therebetween; a mesa formed above the spacer layer; a plurality of quantum dots arranged along the foot of the mesa in a line and discretely; a gate electrode formed above the mesa and the quantum dots; a source electrode connected to the heterojunction interface to form an ohmic contact therebetween; and a drain electrode connected to the heterojunction interface to form an ohmic contact therebetween, the drain electrode being spaced away from the source electrode so that the quantum dots are arranged therebetween.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 34 is a sectional view taken along line D–D' of FIG. 32;

FIG. 35 is an energy band diagram along line A–A' of FIG. 33 when a negative bias is applied to the gate electrode;

FIG. 36 is an energy band diagram along line B–B' of FIG. 33 when a negative bias is applied to the gate electrode;

FIG. 37 is an energy band diagram for the top of the valence band along line C–C' of FIG. 33 when a negative bias is applied to the gate electrode;

FIG. 38 is an energy band diagram along line A–A' of FIG. 33 when holes are being transferred to quantum dots;

FIG. 39 is an energy band diagram along line A–A' of FIG. 33 when the holes are being discharged out of the quantum dots;

FIG. 40 is an energy band diagram along line A–A' of FIG. 33 at the time of readout when no hole is stored in the quantum dots;

FIG. 41 is an energy band diagram along line A–A' of FIG. 33 at the time of readout when holes are stored in the quantum dots;

FIG. 48 shows an arrangement of the quantum dots of FIG. 44;

FIG. 49 is a sectional view of a memory cell according to a seventh embodiment of the present invention;

FIG. 50 is a sectional view of a memory cell according to an eighth embodiment of the present invention;

FIG. 51 is a sectional view of a memory cell according to a ninth embodiment of the present invention;

FIG. 52 shows a method of manufacture of the relaxed SiGe layer of FIG. 51; and

FIG. 53 shows a modification of the method of manufacture of the relaxed SiGe layer of FIG. 51.

DETAILED DESCRIPTION OF THE INVENTION

Before describing the present invention in terms of preferred embodiments, an outline of the present invention will be given first. In the semiconductor layer on the heterojunction interface of heterogeneous semiconductor layers which are stacked one upon the other a V-shaped groove is formed by means of anisotropic etching. The high processing precision of the anisotropic etching can lead to the formation of V-shaped grooves with smooth surface and uniform size and shape.

On the sharp bottom of the V-shaped groove tiny quantum dots are formed in a line and at regular intervals. The proximity of the bottom of the V-shaped groove to the heterojunction interface allows a one-dimensional channel of relatively narrow width to be formed immediately below the heterojunction interface.

A confinement potential in the channel, which is produced by the smooth and abrupt heterojunction interface formed by epitaxial growth and the V-shaped groove, is excellent in uniformity. The quantum dots as charge storage bodies are self-forming quantum dots formed in epitaxial growth of heterojunctions or silicon particles formed from vapor phase in plasma. The quantum dots have a very uniform size.

The injection of carriers into the quantum dots is performed by applying to the gate a positive voltage in the case of an n-channel device or a negative voltage in the case of a p-channel device. Under such a bias condition, carriers will tunnel across the potential barrier, so that they are injected from the channel into the quantum dots for storage.

When carriers are stored in the quantum dots, they become charged positively or negatively. Thereby, (1) the gate voltage is shielded effectively, raising the threshold voltage. (2) When the quantum dots become charged, the resulting Coulomb's repulsive force reduces the density of carriers in the channel. As a result, the one-dimensional narrow channel will be cut into sections or narrowed down.

The combination of the effects (1) and (2) resulting from the charged quantum dots ensures that the channel conductance changes greatly. Thus, the discrimination between "0" and "1" states can be performed with a good margin, allowing the operating voltage or readout current to be set lower than conventional.

Since the quantum dots and the channel can be formed uniformly, variations in performance among cells can be made smaller than conventional even if the dimensions of the memory cells are scaled down. This will promote the increase in packing density.

The present invention will be described next in terms of embodiments thereof.

First Embodiment

Figure 1:
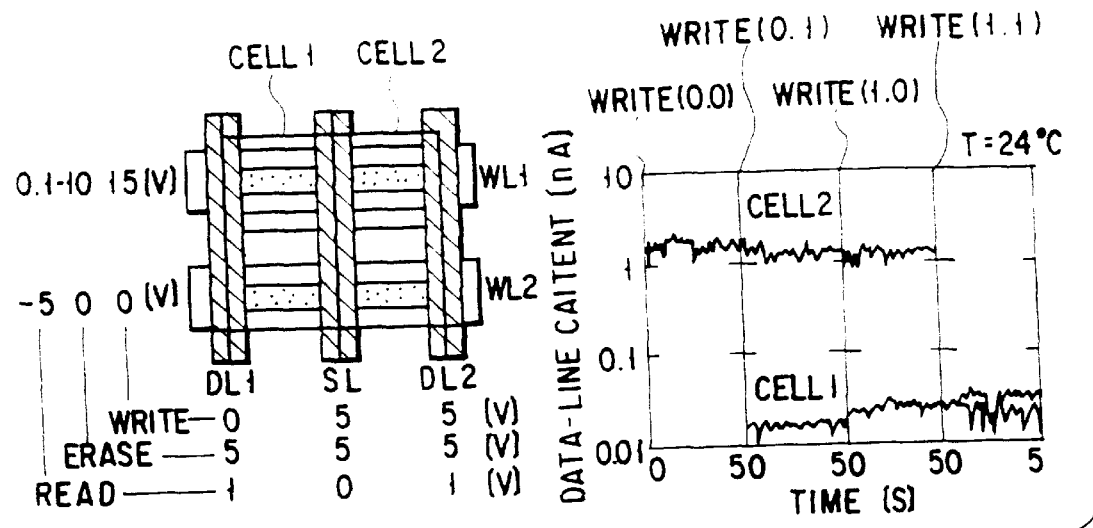
FIG. 1 shows a first technique.
Figure 2:
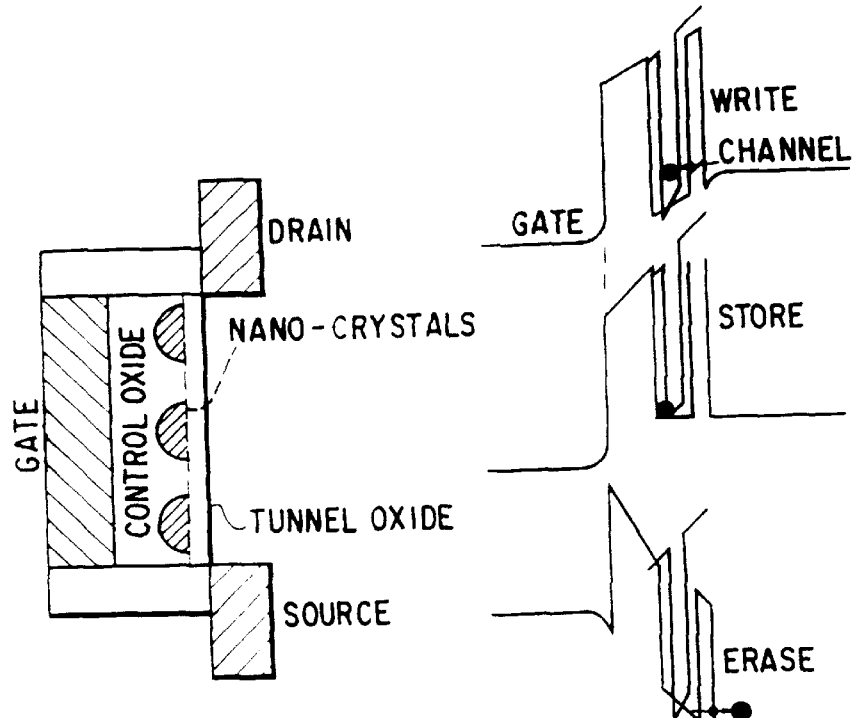
FIG. 2 shows a second technique.
Figure 3:
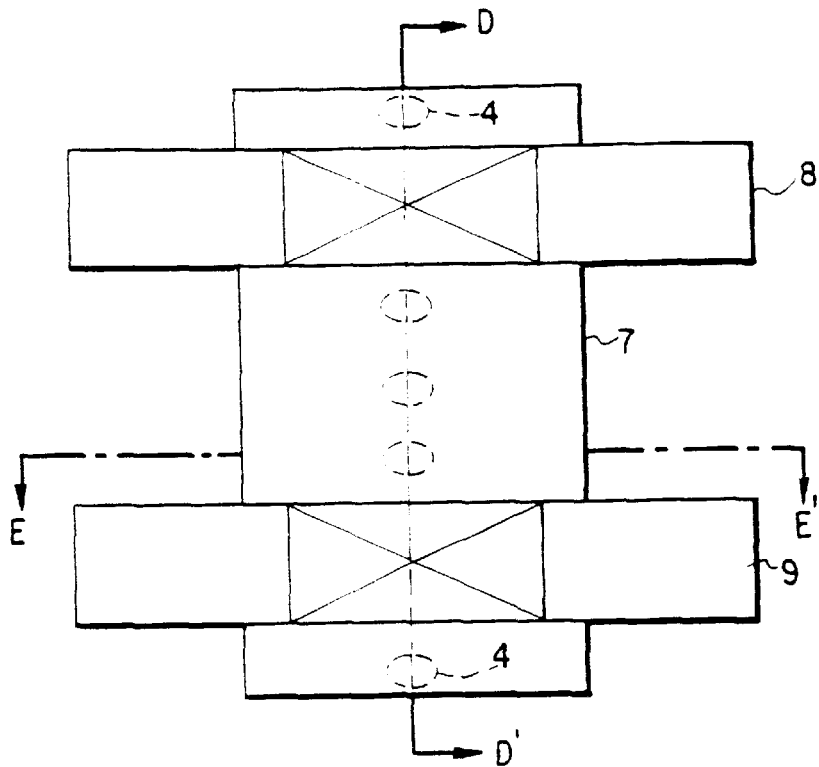
FIG. 3 is a plan view of a memory cell according to a first embodiment of the present invention.

A memory cell according to a first embodiment of the present invention will be described with reference to FIGS. 3, 4, and 5. Specifically, FIG. 3 is a plan view of the memory cell, FIG. 4 a sectional view taken along line E–E' of FIG. 3, and FIG. 5 a sectional view taken along line D–D' of FIG. 3. On a (001) silicon substrate is formed a buffer layer of n-type silicon at a thickness of 100 nm. On this buffer layer is formed a channel layer 1 of undoped $Si_{0.7}Ge_{0.3}$ at a thickness of 10 nm. Further, on the channel layer 1 is formed a spacer layer 2 of undoped silicon that is dissimilar to the channel layer 1.

On the spacer layer 2, an elongate V-shaped groove 3 is formed in the <110> direction by means of anisotropic etching. The V-shaped groove 3 is divided by the facet between the (1-11) plane and the (-111) plane. The spacing d between the sharp bottom of the V-shaped groove 3 and the heterojunction 100 is set at about 10 nm.

On the sharp bottom of the V-shaped groove 3, a plurality of quantum dots 4 consisting of germanium are formed discretely in a line. These dots are capped with a cap layer 5 consisting of p-type silicon and having a thickness of 20 nm. Thus, the quantum dots 4 are maintained electrically floating. The p-type impurity concentration is set at $5 \times 10^{17}$ $cm^{-3}$.

The quantum dots 4 are self-forming quantum dots that are formed on the spacer layer 2 by epitaxial growth of a material that is different in lattice constant from the undoped silicon forming that spacer layer. The reason for the dot-like formation is that the island-like growth allows strain due to the difference in lattice constant between the dots and the underlying crystal to be relieved, leading to the stable energy state. Such a formation method allows the quantum dots 4 to be formed with very high uniformity. For example, InGsAs and InP quantum dots formed on GaAs and Ge (germanium) quantum dots formed on silicon have been reported so far. In the first embodiment, germanium quantum dots are formed on silicon.

In this embodiment, since the width of the V-shaped groove is narrow enough as compared with the diffusion length of the germanium atom on its growth surface, the quantum dots 4 are formed on that sharp bottom of the V-shaped groove 3 which is most stable in energy. On the cap layer 5 that caps the quantum dots are formed a gate electrode 7 made of aluminum as a Schottky electrode. The surface of the gate electrode 7 is oxidized to form an insulating layer 12 of alumina ($Al_2O_3$).

A source electrode 8 is formed to make an ohmic contact with the heterojunction interface 100 or the vicinity thereof through a contact hole formed in the gate electrode 7 and the gate oxide 6. Like the source electrode 8, a drain electrode 9 is also formed to make an ohmic contact with the heterojunction interface 100 or the vicinity thereof. In this case, a plurality of quantum dots (in this embodiment, three quantum dots) are interposed between the source and drain electrodes.

Figure 4:
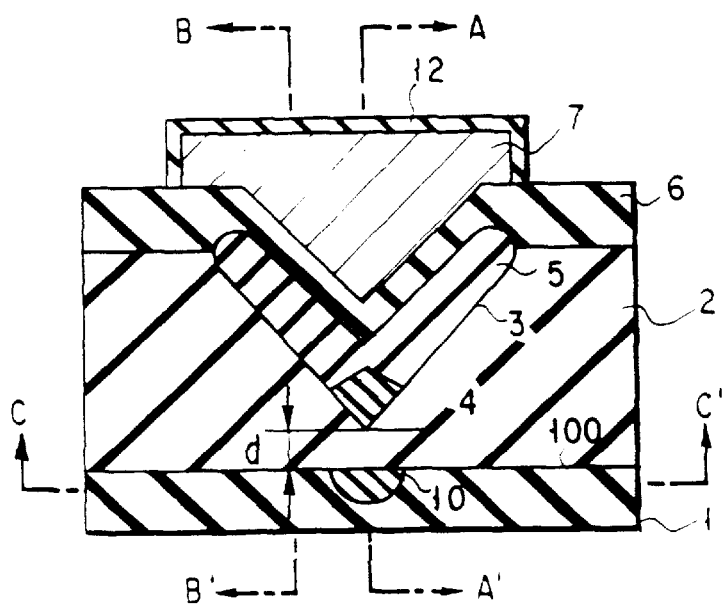
FIG. 4 is a sectional view taken along line E–E' of FIG. 3.
Figure 5:
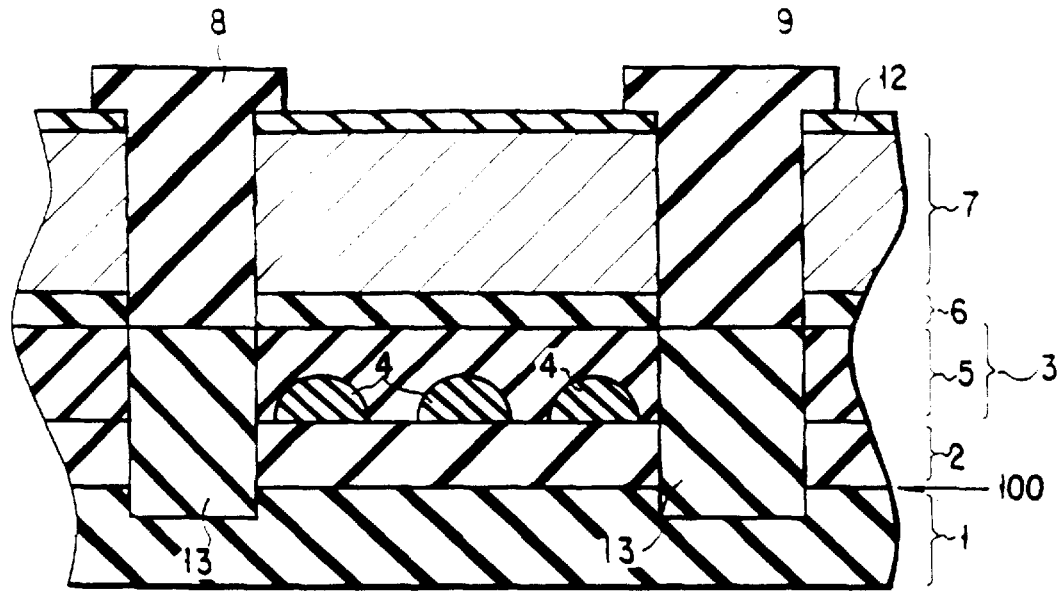
FIG. 5 is a sectional view taken along line D–D' of FIG. 3.
Figure 6:
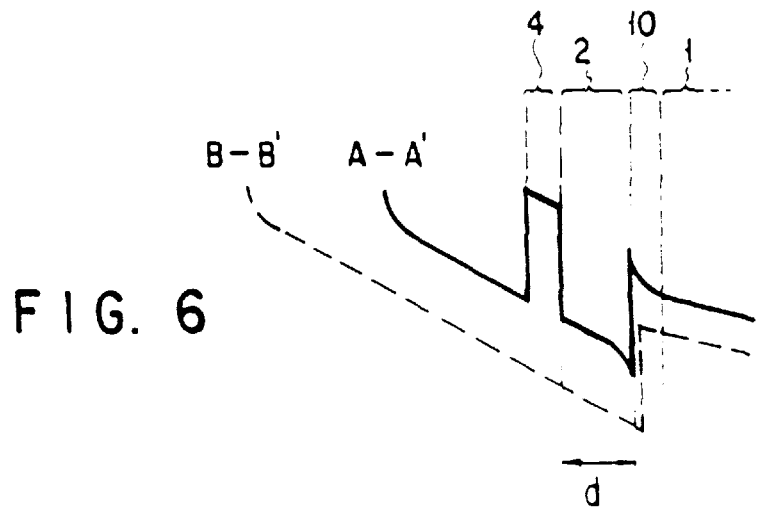
FIG. 6 are energy band diagrams for the top of the valence bands along line A–A' and line B–B' of FIG. 4 when a negative bias is applied to the gate electrode.
Figure 7:
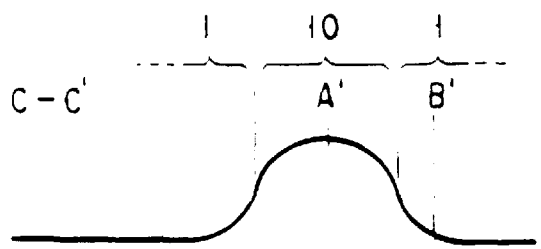
FIG. 7 is an energy band diagram for the top of the valence bands along line C–C' of FIG. 4 when a negative bias is applied to the gate electrode.

In FIG. 6 there are shown energy diagrams at the valence band top edge along line A–A' and line B–B' of FIG. 4 when a negative bias is applied to the gate electrode 7. In FIG. 7 there is shown an energy diagram at the valence band top edge along line C–C' of FIG. 4 when a negative bias is applied to the gate electrode 7. As can be seen from these figures, a channel 10 consisting of holes as carriers is formed in the form of a quantum wire (one-dimensional) in the upper portion of the channel layer 1 immediately below the sharp bottom of the V-shaped groove 3.

Figure 8:
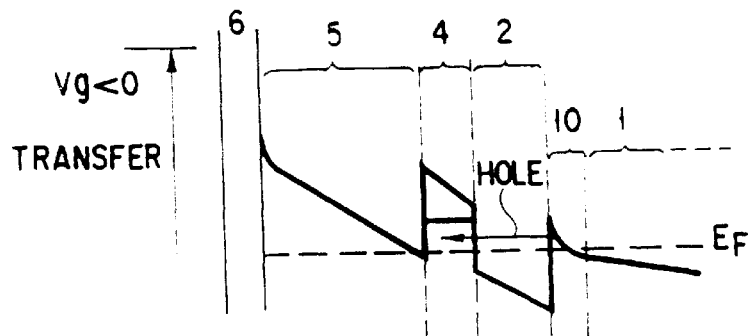
FIG. 8 is an energy band diagram for the top of the valence bands along line A–A' of FIG. 4 when holes are being transferred to quantum dots.
Figure 9:
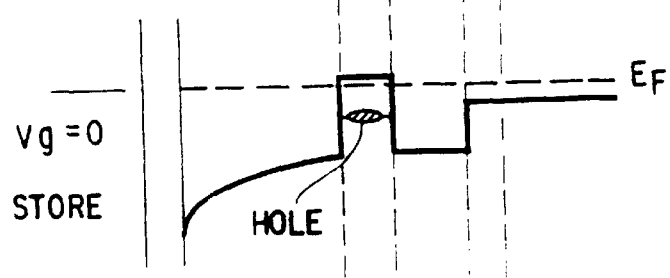
FIG. 9 is an energy band diagram for the top of the valence bands along line A–A' of FIG. 4 when the holes are being stored into the quantum dots.

Next, the operating principles of the memory cell thus arranged will be described. As shown in FIG. 8, when a negative voltage of the order of –3 volts is applied to the gate electrode 7, holes in the channel 10 are injected into the quantum dots 4 as a result of tunneling through the spacer layer 2 and then stored therein as shown in FIG. 9. Thus, the quantum dots 4 become charged positively.

Figure 10:
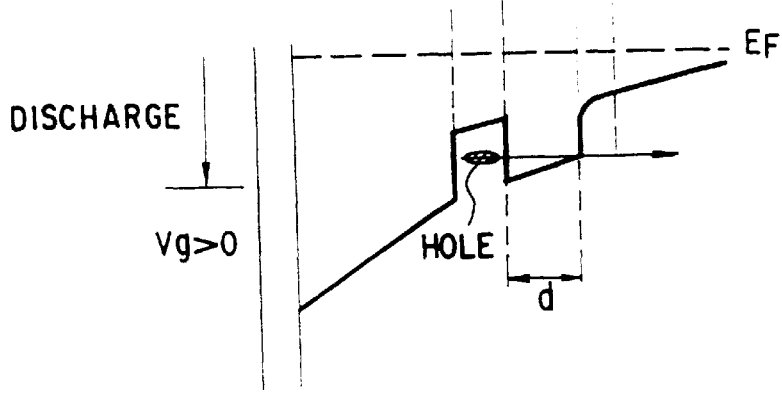
FIG. 10 is an energy band diagram for the top of the valence bands along line A–A' of FIG. 4 when the holes are being discharged out of the quantum dots.

As shown in FIG. 10, when a positive bias of +2 volts or more is applied to the gate electrode 7, the quantum dots 4 drain off holes, which tunnel through the spacer layer 2 to return to the channel layer.

Figures 11, 12:
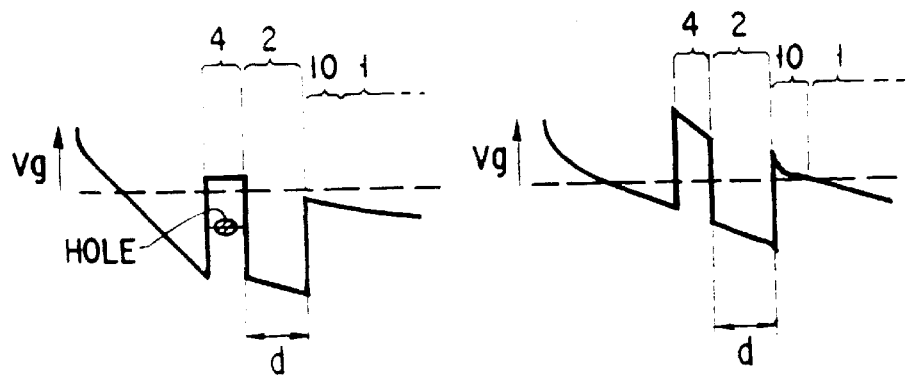
FIG. 11 is an energy band diagram for the top of the valence bands along line A–A' of FIG. 4 at the time of readout when the holes are stored in the quantum dots.
FIG. 12 is an energy band diagram for the top of the valence bands along line A–A' of FIG. 4 at the time of readout when no hole is stored in the quantum dots.

When the quantum dots 4 become charged, the conductance of the channel 10 shifts (lowers). As a result, the drain current changes (decreases), enabling the discrimination between "1" and "0" states of the memory cell. In this case, the conductance changes more greatly than conventional for the following reasons (A) and (B):

(A): when, as shown in FIG. 12, the quantum dots are not charged, i.e., when holes are not injected into the quantum dots, a bias voltage (on the order of −1 volts) applied to the gate electrode 7 is directly applied to the heterojunction interface 100, increasing the density of carriers (holes) in the channel 10. As a result, the source-to-drain conductance ρd increases.

On the other hand, when, as shown in FIG. 11, the quantum dots 4 are charged, i.e., when holes are injected into the quantum dots, the bias voltage applied to the gate electrode 7 is screened by the quantum dots 4, lessening the effect of the bias voltage on the heterojunction interface 100. As a result, since the density of carriers (holes) in the channel 10 is not increased much, the source-to-drain conductance ρc does not increase.

Figure 13:
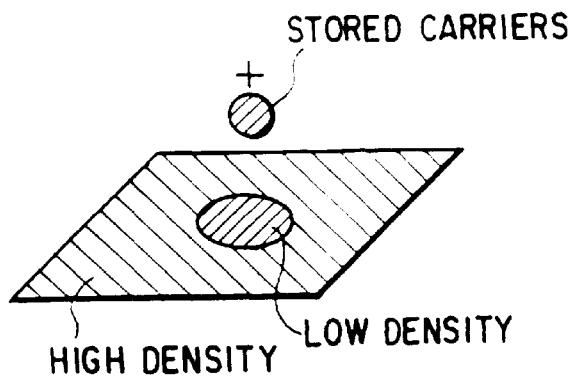
FIG. 13 shows the distribution of hole density over a conventional two-dimensional channel which is wide enough to keep the conductance irrespective of Coulomb's repulsive force of stored carriers (holes) in the quantum dots.
Figure 14:
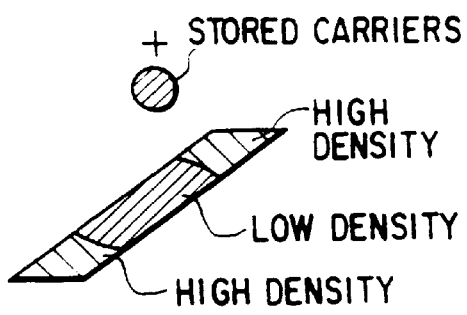
FIG. 14 shows the distribution of hole density over a narrow channel which is easily cut off by Coulomb's repulsive force of stored carriers (holes) in the quantum dots.

(B): carriers that are injected into the quantum dots 4 are holes which are the same as carriers in the channel 10. Therefore, immediately under the quantum dots 4, the density of holes decreases due to Coulomb's repulsive force. In the present embodiment, since the channel 10 is made in the form of a wire (one-dimensional) as shown in FIG. 14, the channel 10 will be electrically separated into sections or narrowed down immediately below the quantum dots 4. If, as shown in FIG. 13, the channel were made two-dimensional with a relatively large width, not in the form of a wire, the portion in which the density of holes is reduced by Coulomb's repulsive force would appear very partially relative to the entire width of the channel. Accordingly, the channel would be neither separated nor narrowed down effectively and hence a change in conductance would be small.

The combination of the effects discussed in (A) and (B) will make a very great difference in channel conductance between when the quantum dots 4 are charged and when they are not.

Figure 15:
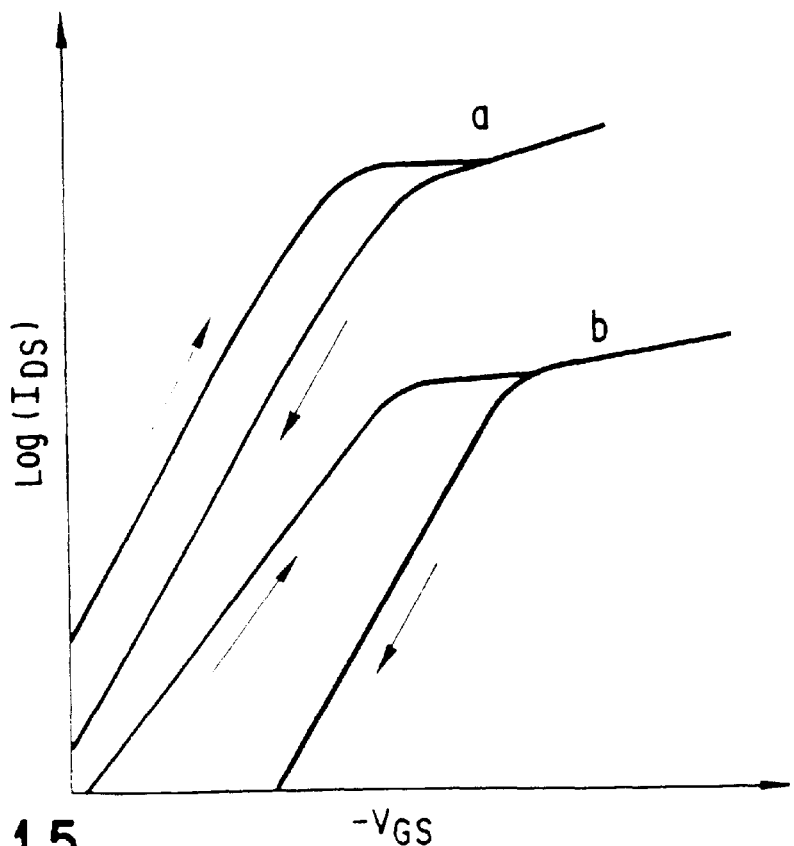
FIG. 15 shows current-voltage curves for the device of the first embodiment and the conventional device of FIG. 2.

In FIG. 15 there is shown the dependence of source-drain current IDS on gate voltage $V_{GS}$. In this figure, "a" indicates the characteristic of the conventional device, while "b" indicates the characteristic of the memory cell of the present invention. The upward directing arrow represents how the current changes when the gate voltage is increased from zero in the negative direction in the state where the quantum dots 4 are not charged, while the downward directing arrow represents how the current changes when the gate voltage is changed from negative voltage to zero in the state where the quantum dots are charged. As can be seen from this characteristic diagram, in the memory cell of the present embodiment a margin for the threshold voltage is larger than in the conventional memory device.

Figure 16:
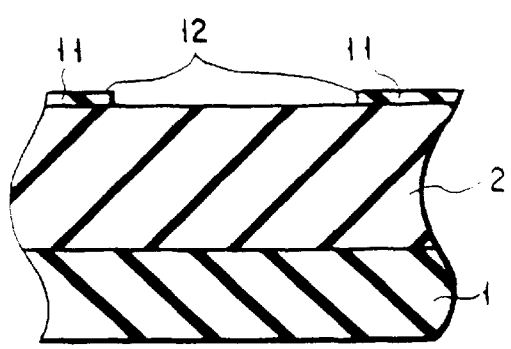
FIG. 16 shows a first step of manufacture of the cell according to the first embodiment of the present invention.

Next, reference will be made to FIGS. 16 through 21 to describe a method of manufacture of the memory cell according to the first embodiment of the present invention. First, as shown in FIG. 16, on the major surface of a (001) silicon substrate of n-type conductivity not shown, the n-type silicon buffer layer, the undoped $Si_{0.7}Ge_{0.3}$ channel layer 1 and the undoped silicon spacer layer 2 are epitaxially grown in sequence by means of MBE (molecular beam epitaxy) or CVD (chemical vapor deposition).

Figure 17:
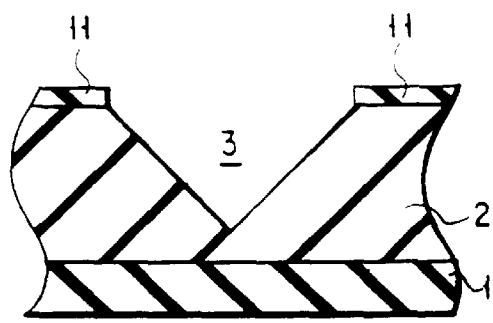
FIG. 17 shows a second step of manufacture of the cell according to the first embodiment of the present invention.

An $SiO_2$ mask layer 11 is then formed over the spacer layer 2 by means of thermal oxidation or CVD. A slit 12 is then formed in the mask layer 11 in the <110> direction by means of electron-beam lithography and hydrofluoric acid-based etching techniques. After the formation of the slit 11, the undoped silicon spacer layer 2 is etched by a solution of potassium hydroxide to form the V-shaped groove 3 as shown in FIG. 17.

Figure 18:
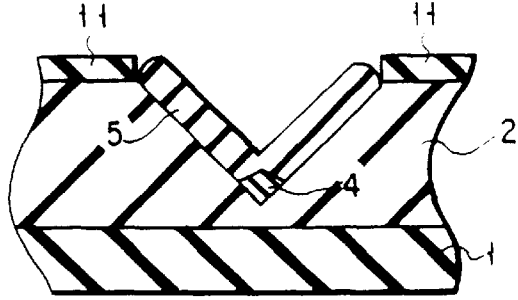
FIG. 18 shows a third step of manufacture of the cell according to the first embodiment of the present invention.
Figure 22:
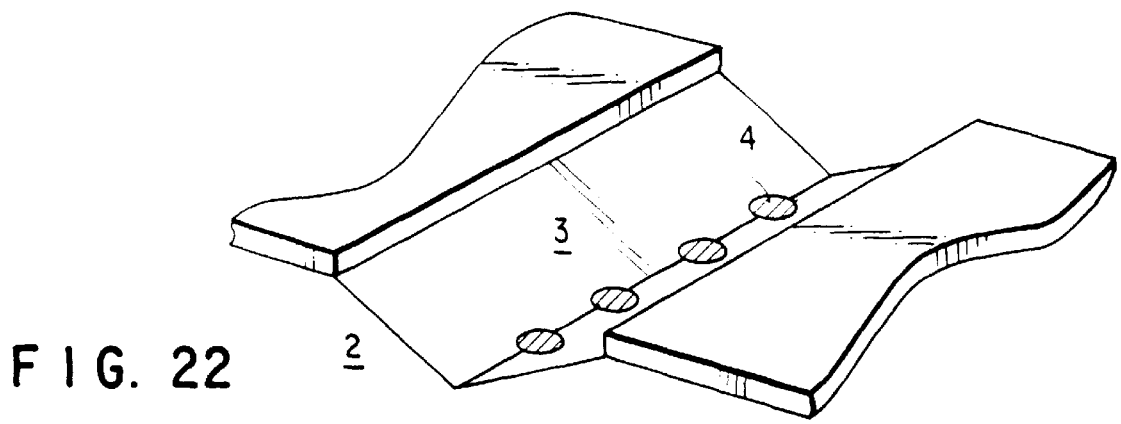
FIG. 22 shows an arrangement of the quantum dots of FIG. 18.

After the formation of the V-shaped groove 3, as shown in FIG. 18, germanium is epitaxially grown to a thickness of five-atomic layer under selective growth conditions set. Thereby, as shown in FIG. 22, the quantum dots 4 are formed in a line and at regular intervals on the sharp bottom of the V-shaped groove 3. Each of the quantum dots is about 30 nm in diameter and about 10 nm in height.

Figure 19:
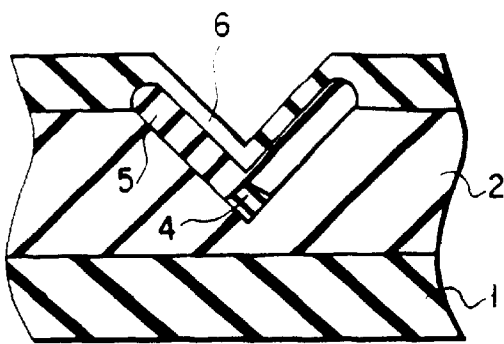
FIG. 19 shows a fourth step of manufacture of the cell according to the first embodiment of the present invention.
Figure 20:
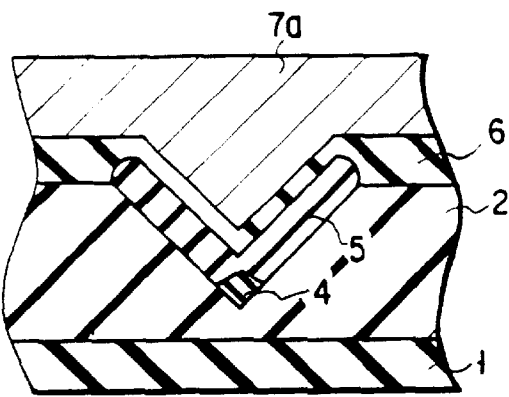
FIG. 20 shows a fifth step of manufacture of the cell according to the first embodiment of the present invention.
Figure 21:
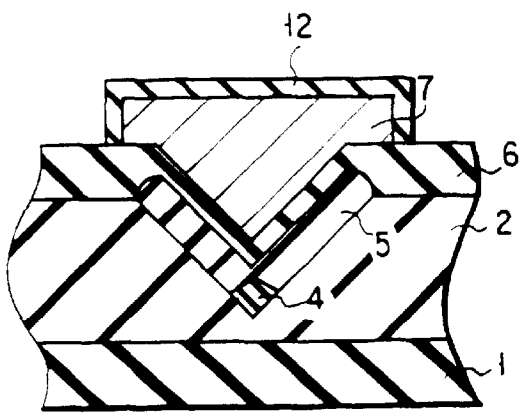
FIG. 21 shows a sixth step of manufacture of the cell according to the first embodiment of the present invention.

The cap layer 5 of p-type silicon is formed on the quantum dots 4, whereby the quantum dots are buried. An insulating layer 6 is formed over the spacer 2 and the cap layer 5 by means of thermal oxidation as shown in FIG. 19. A layer 7a made of aluminum is formed over the surface of the insulating layer 6 as shown in FIG. 20, and the aluminum layer 7a is patterned to form the gate electrode 7 as shown in FIG. 21. Finally, a contact hole is formed in the gate electrode 7, then p-type ohmic contact is formed by boron ions implanting, source-drain electrode is formed by Al or $p^+$-poly-Si.

The present embodiment can be modified in various ways. For example, instead of using p-type silicon, the cap layer 5 may be formed of an undoped silicon layer containing a boron δ doped layer. The gate electrode 7 may be made of any metal that can form a Schottky junction with p-type silicon, for example, titanium. The insulating layer 6 on the cap layer 5 is not necessarily required. Use may be made of any structure that allows the portion below the V-shaped groove to act as an FET.

Second Embodiment

Figure 23:
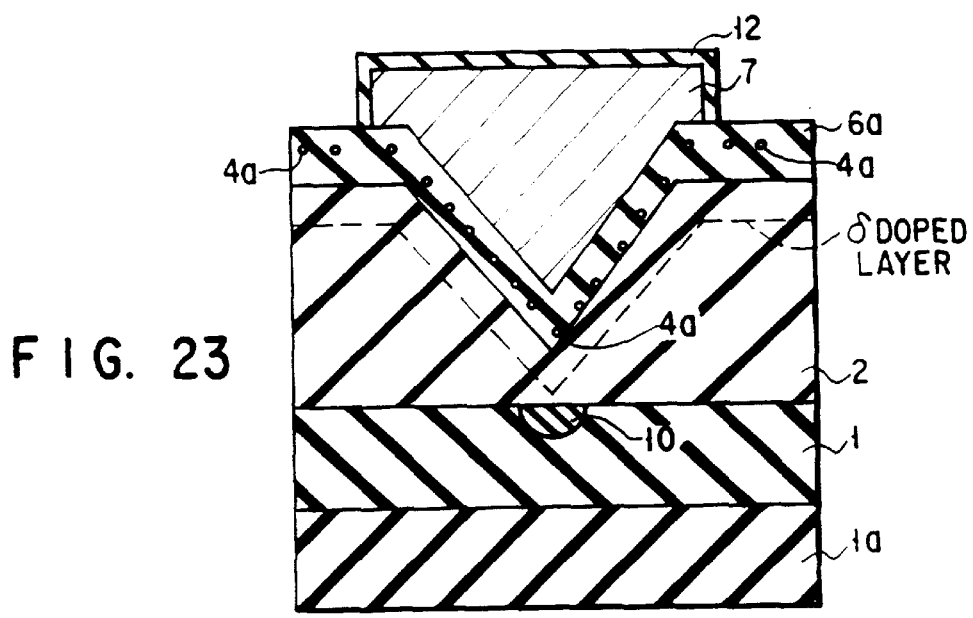
FIG. 23 is a sectional view of a memory cell according to a second embodiment of the present invention.

FIG. 23 shows a sectional view of a memory cell according to a second embodiment of the present invention. The second embodiment is most distinct from the first embodiment in that quantum dots 4a are buried as silicon microcrystals in an insulating layer (gate oxide) 6a. Such a structure can be created by introducing a material gas, such as silane, into plasma and causing vapor-phase reactions, or low-pressure CVD method. As in the first embodiment, in the second embodiment the quantum dots 4a can be formed uniformly in size using such a method. The silicon microcrystals are deposited on an oxide layer that is formed by thermal oxidation on the undoped silicon spacer layer 2 containing boron δ doped layer and is very thin, say, of the order of 1 nm. A layer of silicon dioxide is then formed by means of CVD to bury the quantum dots 4a, thereby forming a gate oxide 6a.

Third Embodiment

Figure 24:
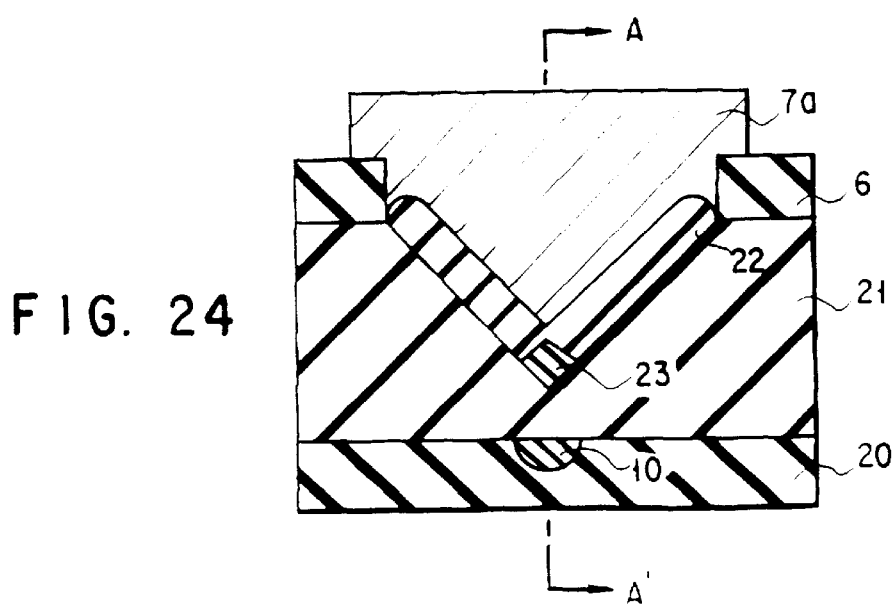
FIG. 24 is a sectional view of a memory cell according to a third embodiment of the present invention.

The present invention can also be implemented by the use of GaAs compound semiconductors. The point of the third embodiment will be described with reference to FIG. 24 illustrating a section of the memory cell. The third embodiment is distinct from the first embodiment in the following six points:

(1) Although, in the first embodiment, the channel layer 1 is formed of undoped SiGe, in this embodiment a channel layer 20 is formed of undoped GaAs.

(2) Although, in the first embodiment, the spacer layer 2 is formed from undoped silicon, in this embodiment use is made of a spacer layer 21 consisting of undoped AlGaAs.

(3) Although the first embodiment uses p-type silicon for the cap layer 5, this embodiment uses a layer of n-type AlGaAs as a cap layer 22.

(4) Although, in the first embodiment, the quantum dots 4 are formed from germanium (Ge), in this embodiment quantum dots 23 are formed from InAs.

(5) In this embodiment, a gate electrode 7a is formed from Ti/Au or Ti/Pt/Au, so that it acts as a Schottky electrode.

Figure 25:
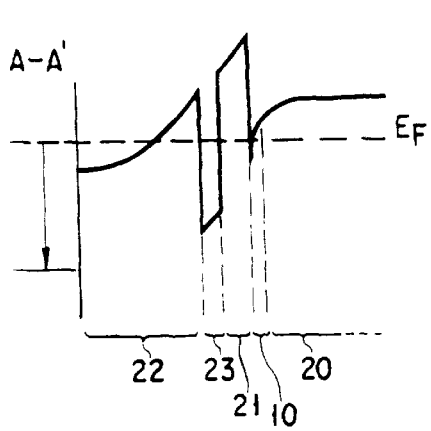
FIG. 25 is an energy band diagram for the bottom of the conduction bands along line A–A' of FIG. 24.

(6) Although, in the first embodiment, carriers are holes, in this embodiment carriers are electrons as can be seen from FIG. 25.

Fourth Embodiment

Figure 26:
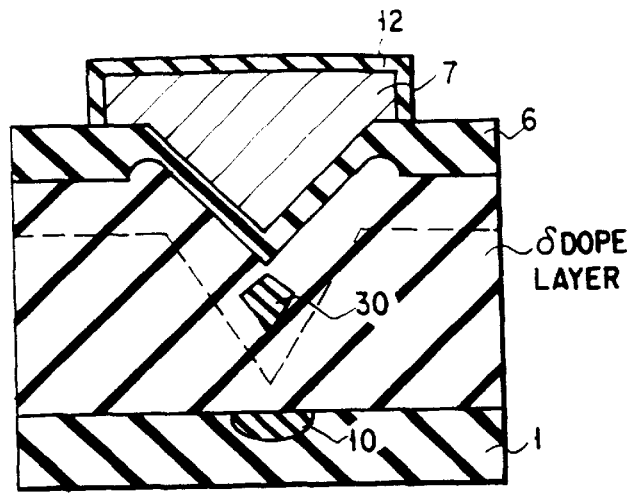
FIG. 26 is a sectional view of a memory cell according to a fourth embodiment of the present invention.

In FIG. 26 there is illustrated a cross section of a memory cell according to a fourth embodiment of the present invention. This embodiment is characterized in that quantum dots 30 formed from germanium are positioned in the vicinity of the gate electrode 7. In this embodiment as well, quantum dots 30 are formed on the bottom of the V-shaped groove. On the quantum dots are stacked a spacer layer 2, an $SiO_2$ gate oxide 6, an Al gate electrode 7. The charge injection into the quantum dots 30 is performed from the side of the gate electrode 7 through the gate oxide 6.

In this embodiment, since the spacing between the quantum dots 30 and the channel 10 is set longer than in the first embodiment, the write voltage needs to be higher than in the first embodiment, but the carrier holding time can be made longer than in the first embodiment.

Fifth Embodiment

Figure 27:
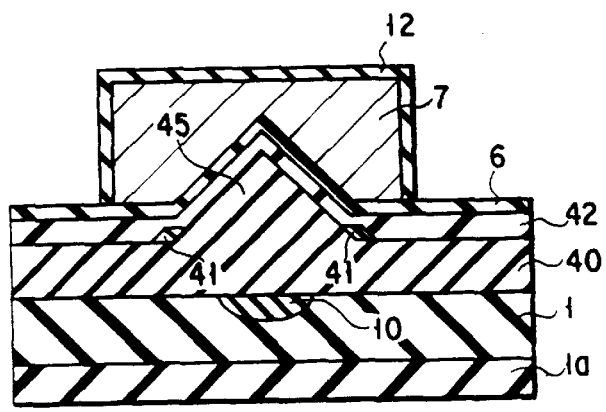
FIG. 27 is a sectional view of a memory cell according to a fifth embodiment of the present invention.
Figure 28:
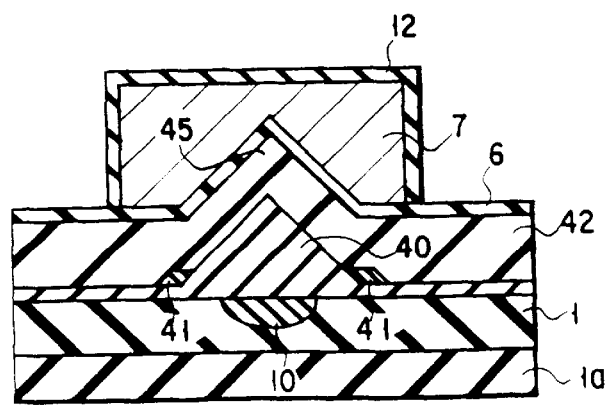
FIG. 28 is a sectional view of a modification of the memory cell according to a fifth embodiment of the present invention.

In FIGS. 27 and 28 there are illustrated cross sections of different types of memory cells according to a fifth embodiment of the present invention. Specifically, FIG. 27 shows a memory cell in which holes are injected from the gate electrode 7 into quantum dots 41, while FIG. 28 shows a memory cell in which holes are injected from the channel 10 into the quantum dots 41. Although, in the first embodiment, the V-shaped groove 3 is formed in the undoped silicon spacer layer 2, in this embodiment a mesa 45 which is triangular in cross section is formed above a p-type silicon spacer layer 40.

The quantum dots 41 are formed along the foot of the mesa 45. Over the spacer layer 40 with such a mesa structure 45 is formed a layer 42 of undoped silicon. The undoped silicon layer 42 is then subjected to thermal oxidation to form the gate oxide 6 on its surface. The gate electrode 7 is then formed on the gate oxide 6.

Figure 29:
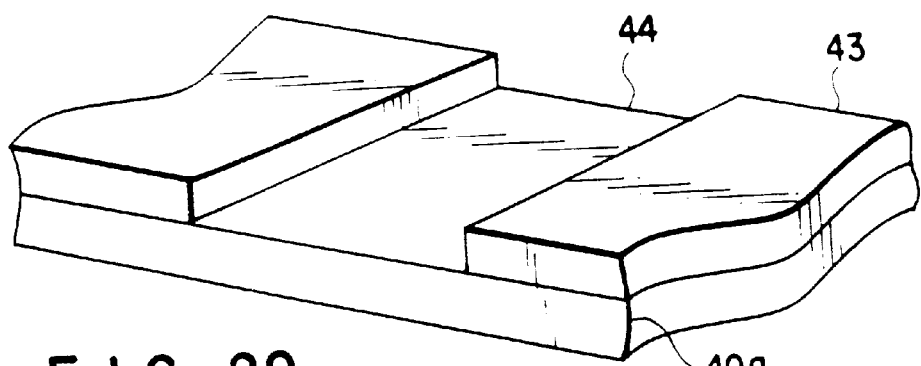
FIG. 29 shows a first step of manufacture of the mesa structure of FIGS. 27 and 28.
Figure 30:
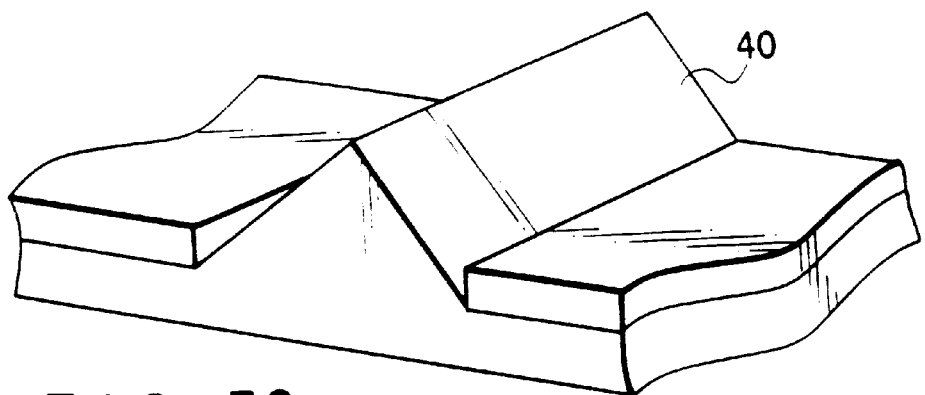
FIG. 30 shows a second step of manufacture of the mesa structure of FIGS. 27 and 28.
Figure 31:
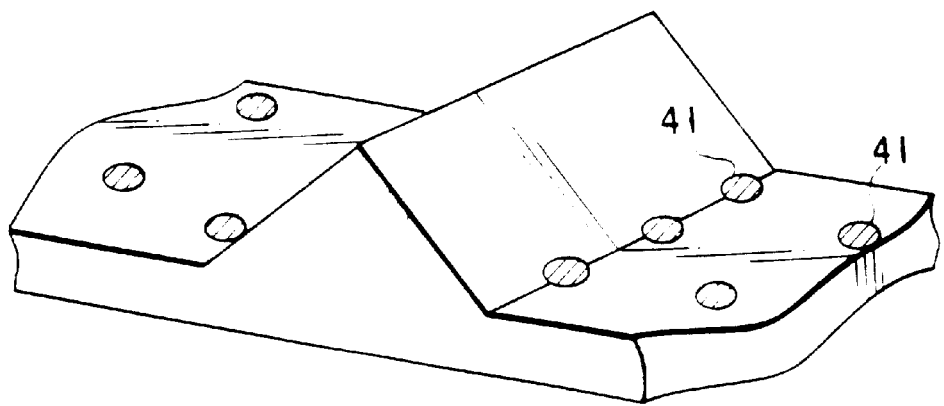
FIG. 31 shows a third step of manufacture of the mesa structure of FIGS. 27 and 28.

FIGS. 29, 30 and 31 show main steps of manufacture of the memory cell of the fifth embodiment. First, as shown in FIG. 29, a mask layer 43 of silicon dioxide is formed over the p-type silicon spacer layer 40 and then a slit 44 is formed in the mask layer in the <110> direction by means of ordinary electron-beam lithography and hydrofluoric-based etching techniques.

The resultant structure is placed in epitaxial growth equipment for selective growth of the p-type silicon layer, and a mesa 40 having the facet between the (1-11) plane and the (-111) plane is formed which is triangular in cross section as shown in FIG. 30.

Next, the mask layer 43 is removed. The resultant structure is again placed in the epitaxial growth equipment, and then germanium is grown up to a five-atomic layer, so that, as shown in FIG. 31, quantum dots 41 of germanium are formed along the feet of the mesa 40 and on the surface regions relatively away from the mesa. Each of the quantum dots is about 30 nm in diameter and about 10 nm in height.

Sixth Embodiment

Figure 32:
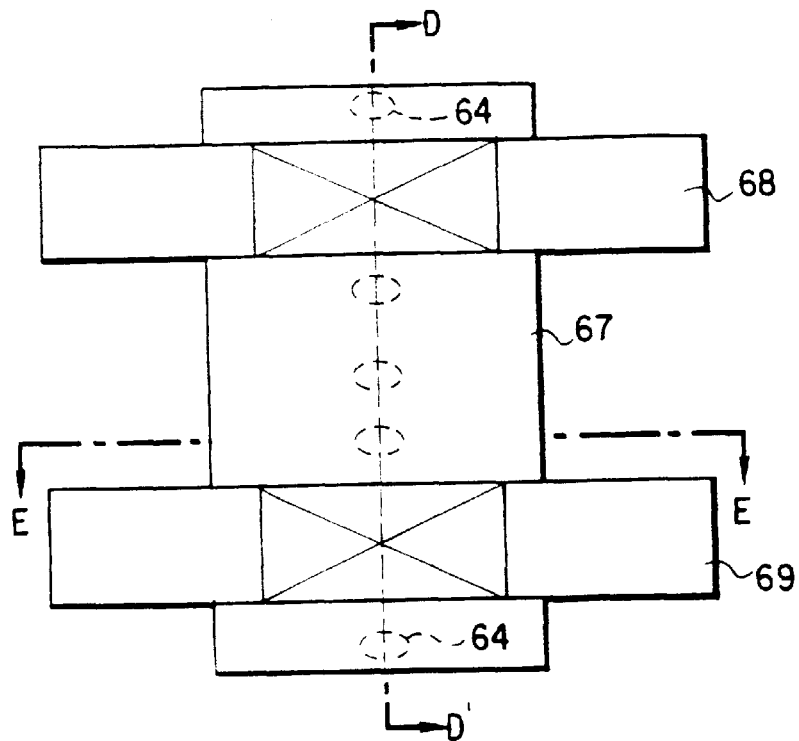
FIG. 32 is a plan view of a memory cell according to a sixth embodiment of the present invention.
Figure 33:
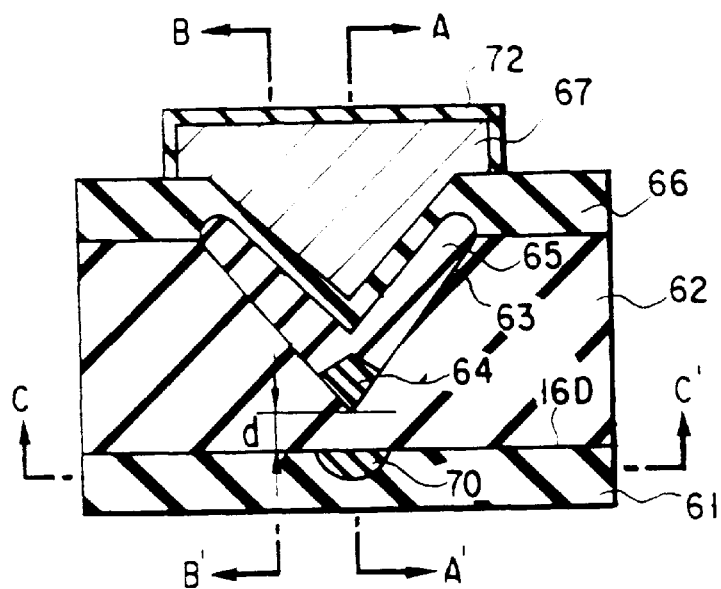
FIG. 33 is a sectional view taken along line E–E' of FIG. 32.

FIG. 32 is a plan view of a memory cell according to a sixth embodiment, FIG. 33 a sectional view taken along line E–E' of FIG. 32, and FIG. 34 a sectional view taken along line D–D' of FIG. 32. Over a (001) silicon substrate a buffer layer of n-type silicon is formed at a thickness of 100 nm. Over the buffer layer a channel layer 61 of n-type $Si_{0.7}Ge_{0.3}$ is formed at a thickness of 10 nm. The density of n-type impurity is $1.0 \times 10^{15}$ cm$^{-3}$. Over the channel layer 61 a spacer layer 62 of n-type silicon dissimilar to the channel layer 61 is formed at a thickness of 50 nm.

An elongate V-shaped groove 63 is formed in the spacer layer 62 in the <110> direction by means of anisotropic etching. The V-shaped groove is divided by the facet between the (1-11) plane and the (-111) plane. The spacing between the bottom of the V-shaped groove 63 and the heterojunction interface 160 between the channel layer 61 and the spacer layer 62 is set to about 5 nm.

On the sharp bottom of the V-shaped groove 63 a plurality of quantum dots consisting of germanium are formed in a line and at regular intervals. The quantum dots are covered with an n-type silicon cap layer 65 of 2 nm in thickness. Thereby, the quantum dots are maintained electrically floating.

The quantum dots 64 are self-forming quantum dots that are formed by epitaxially growing on the spacer layer 62 a material different in lattice constant from the n-type silicon. The dot formation allows strain due to the difference in lattice constant from the underlying crystal to be relieved, maintaining energetically stable state. In addition, the size of the quantum dots can be made very uniform. For example, InGaAS and InP quantum dots on GaAs and Ge quantum dots on silicon have been reported so far.

In the sixth embodiment, since the growth speed of germanium is highest at the bottom of the V-shaped groove 63 highest in atomic step density, the germanium quantum dots 64 are formed aligned on the bottom of the groove. Each of the quantum dots 64 is about 2 nm in height and about 20 nm in diameter. The cap layer 65 covering the quantum dots and the spacer layer 62 is covered with an insulating layer 66 of silicon oxide. On the insulating layer 66 is formed a gate electrode 67 made of n$^+$-poly-Si, the surface of which is subjected to oxidation to form an insulating layer 72.

A source electrode 68 forms an ohmic contact with the heterojunction interface 160 between the channel layer 61 and the spacer layer 62 or the vicinity thereof via a through hole formed in the gate electrode 67 and the insulating layer 66. Like the source electrode 68, a drain electrode 69 is formed to provide ohmic contact with the heterojunction interface 160 or the vicinity thereof. In this example, the source and drain electrodes are spaced away from each other with three quantum dots arranged therebetween.

In FIGS. 35, 36 and 37, energy diagrams along lines A–A', B–B' and C–C' of FIG. 33 are illustrated, respectively. When a negative bias is applied to the gate electrode 67. As can be seen from these figures, an inversion layer is formed in the upper portion of the channel layer 61 immediately below the sharp bottom of the V-shaped groove 63, whereby a channel 70 using holes as carriers is formed in the form of a quantum wire (one-dimensional).

Next, the operating principles will be described. At the time of writing, a negative voltage of about −3 volts is applied to the gate electrode 67. A hole in the inversion channel formed in the vicinity of the interface 160 between the channel layer 61 and the spacer layer 62 tunnels through the spacer layer 62 into one of the quantum dots 64 as shown in FIG. 38. By the Coulomb-blockade effect, one hole is injected into one quantum dot. The hole injection allows each of the quantum dots to be charged positively.

At the time of erasing, a positive bias of +2 volts or more is applied to the gate electrode 67. The hole is discharged from the quantum dot and tunnels through the spacer layer 62 to return to the channel layer 61 as shown in FIG. 39.

When the quantum dots become charged, the conductance of the channel 70 shifts (lowers). The resulting change (decrease) in drain current allows the discrimination between "1" and "0" states of the memory cell. The change in conductance becomes greater than conventional from the following two reasons (A) and (B):

(A): when, as shown in FIG. 40, holes are not injected in the quantum dots i.e., when the quantum dots are not charged, a bias voltage (on the order of −1 volts) applied to the gate electrode 7 is directly applied to the heterojunction interface 100, increasing the density of carriers (holes) in the channel 10. As a result, the source-to-drain conductance ρd increases.

On the other hand, when, as shown in FIG. 41, holes are injected in the quantum dots 64 i.e., when the quantum dots are charged positively, the bias voltage applied to the gate electrode 7 is screened by the quantum dots 64, lessening the effect of the bias voltage on the heterojunction interface 160. As a result, the density of carriers (holes) in the channel 70 will not increase and hence the source-to-drain conductance ρc does not increase.

(B): carriers that are injected into the quantum dots 4 are holes which are the same as carriers in the channel 70. Therefore, immediately below the quantum dots 64, the density of holes decreases due to Coulomb's repulsive force. As described in connection with the first embodiment, in the present embodiment as well, since the channel 70 is in the form of a wire (one-dimensional), the channel 70 will be cut into sections or narrowed down immediately below the quantum dots 64.

The combination of the effects discussed in (A) and (B) will make a very great difference in channel conductance between when the quantum dots 64 are charged and when they are not.

Figure 42:
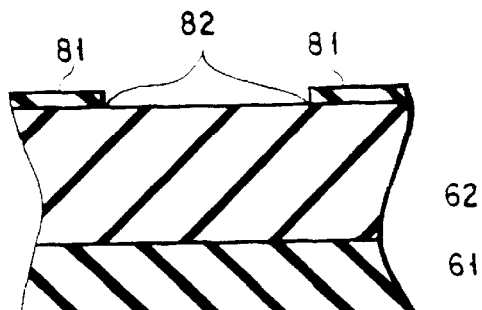
FIG. 42 shows a first step of manufacture of the dell according to the sixth embodiment of the present invention.
Figure 43:
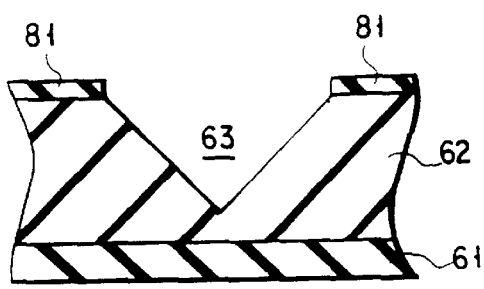
FIG. 43 shows a second step of manufacture of the cell according to the sixth embodiment of the present invention.

Next, reference will be made to FIGS. 42 through 47 to describe a method of manufacture of the memory cell according to the sixth embodiment. First, as shown in FIG. 42, over a (001) p-type silicon substrate not shown are formed in sequence an n-type silicon buffer layer, a channel layer 61 of n-type $Si_{0.7}Ge_{0.3}$, and a spacer layer 62 of n-type silicon by means of epitaxial growth techniques such as MBE or CVD. A mask layer 81 of silicon dioxide is then formed over the spacer layer 62 by means of thermal oxidation or CVD techniques. A slit 82 in the <110> direction is formed in the mask layer 81 by means of electron-beam lithography and hydrofluoric acid-based etching techniques. After the formation of the slit, the spacer layer 62 of n-type silicon is etched using a potassium hydrooxide solution to form the V-shaped groove 63 in the spacer layer as shown in FIG. 43.

Figure 45:
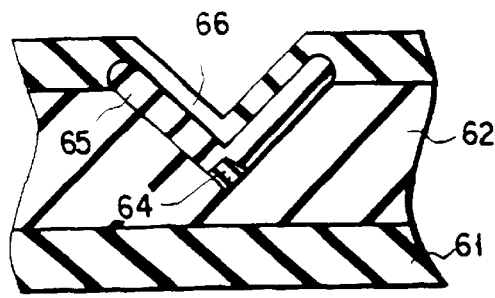
FIG. 45 shows a fourth step of manufacture of the cell according to the sixth embodiment of the present invention.
Figure 44:
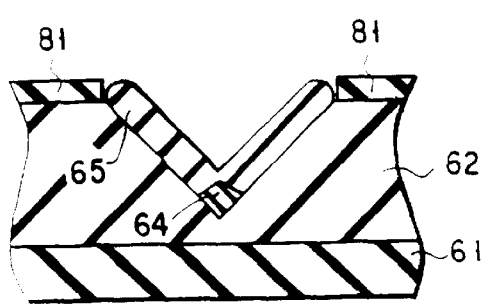
FIG. 44 shows a third step of manufacture of the cell according to the sixth embodiment of the present invention.
Figure 47:
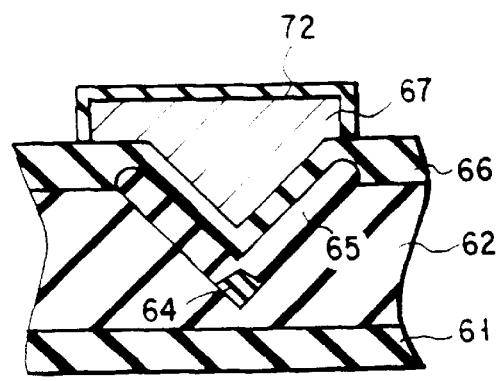
FIG. 47 shows a sixth step of manufacture of the cell according to the sixth embodiment of the present invention.

After the formation of the V-shaped groove, the resultant structure is again placed in the epitaxial growth equipment and then subjected to anneal at a temperature of 900° C. to clean the surface of the groove. With selective growth conditions set, germanium is epitaxially grown up to a six-atomic layer as shown in FIG. 44. Thus, the quantum dots 64 are formed in a line and at regular intervals on the sharp bottom of the V-shaped groove 63 as shown in FIG. 48. Each of the quantum dots is about 20 nm in diameter and about 2 nm in height. The cap layer 65 of n-type silicon is then formed to cover the quantum dots 64. The insulating layer 66 is next formed on the surface of the cap layer 65 by means of thermal oxidation as shown in FIG. 45.

Figure 46:
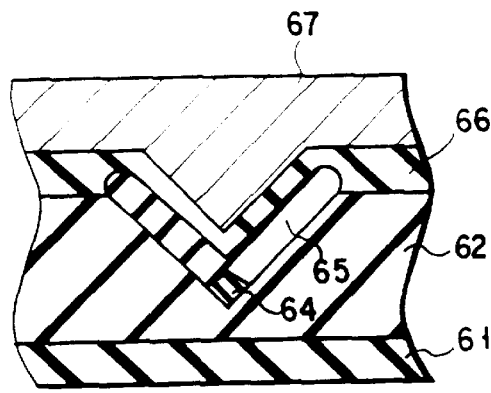
FIG. 46 shows a fifth step of manufacture of the cell according to the sixth embodiment of the present invention.

The gate electrode 67 of $n^+$-poly-Si is formed as shown in FIG. 46. A contact hole is formed in the gate electrode 67, and boron ions are implanted into the contact hole to form a p-type ohmic junction. The source electrode 68 and the drain electrode 69 are formed, which are made of aluminum. The gate electrode 67, the source electrode 68 and the drain electrode 69 are each insulated by a gate oxide.

Seventh Embodiment

FIG. 49 shows a section of a memory cell according to a seventh embodiment of the present invention. The seventh embodiment is most distinct from the sixth embodiment in that silicon microcrystals as quantum dots 84 are buried in the gate oxide 66 of silicon dioxide. Such a structure can be created by introducing a material gas, such as silane, into plasma and causing vapor-phase reactions or low-pressure CVD method. These methods are also useful in providing uniformity in dot size. The silicon microcrystals are deposited on a thermally grown layer of 1 nm in thickness on the n-type silicon spacer layer 62 and then buried with a silicon dioxide layer formed by CVD, for example. Thereby, the gate oxide 66 in which the quantum dots are buried are formed.

Unlike the sixth embodiment, in the seventh embodiment it is difficult to form the quantum dots 84 only on the bottom of the V-shaped groove. However, since the channel 70 forms a wire structure, if even a part of it is cut off, its conductance will be extremely reduced. Thus, a change in the memory state depends largely on whether the quantum dots 84 close to the channel 70 are charged or not. That is, since it is the quantum dots which are formed on the bottom of the V-shaped groove and in the neighborhood thereof that determine the memory state, the effect of distribution of the quantum dots in other regions offer no problem in practical use.

With such a memory cell structure, a voltage that is higher than in the sixth embodiment is required at the time of writing. However, since the silicon dioxide layer having a sufficient barrier height is present between the quantum dots 84 and the channel 70, the charge holding time can be made long.

Eighth Embodiment

In FIG. 50, there is illustrated in sectional form a memory cell according to an eighth embodiment of the present invention. The seventh embodiment, which is a modification of the seventh embodiment, is characterized in that charges are injected into the quantum dots 84 of silicon from the side of the gate electrode 67. The spacing between the quantum dots 84 and the gate electrode of $p^+$-poly-Si, which are close to each other, is set at 1 nm, and the spacing between the quantum dots and the spacer layer 62 is set at 5 nm.

The injection of holes into the quantum dots 84 is performed by applying a positive voltage to the gate electrode. In other respects, the eighth embodiment remains unchanged from the seventh embodiment.

Ninth Embodiment

FIG. 51 shows a section of a memory cell according to a ninth embodiment of the present invention. In this embodiment, on a relaxed p-type $Si_{0.3}Ge_{0.7}$ layer 91 is formed a strained p-type silicon layer 92, which is used as the channel layer. When a positive voltage is applied to the gate electrode 67 of $p^+$-poly-Si, an inversion layer is formed at the interface between the strained p-type silicon layer 92 and the relaxed p-type $Si_{0.3}Ge_{0.7}$ layer 93, whereby a channel is formed in a wire structure, which uses electrons as carriers. As in the seventh embodiment, the quantum dots 84 of silicon are distributed on the channel side. Electrons are injected from the channel into the quantum dots 84 under the influence of a positive voltage applied to the gate electrode 67.

The relaxed p-type $Si_{0.3}Ge_{0.7}$ layer 93 can be formed by the method illustrated in FIG. 52 or FIG. 53. The method in FIG. 52 is one to form on a silicon substrate an SiGe layer at a thickness of 1 micrometers or more by means of epitaxial growth techniques. In the formation of this layer, lattice defects due to the difference in lattice constant between the silicon substrate and the SiGe layer are produced at a high density on the substrate side. The defect density in the vicinity of the surface is relatively low. In the method in FIG. 53, an SOI (Si thin film on an insulating substrate; here silicon dioxide is used as insulating film) is formed at a thickness of 50 nm or less and an SiGe layer is epitaxially grown on the SOI at a thickness of 50 to 200 nm at a low temperature of 600° C. or below by means of MBE or UHV-CVD. The resultant structure is then subjected to anneal at a high temperature of 800° C. or more. As a result, a slip occurs between the underlying SOI and the silicon dioxide to form the relaxed SiGe layer. For this method, refer to A. R. Powell et al., Appl. Phys. Lett. 64, p1856 (1994).

The strained Si channel layer 92 and the relaxed SiGe cap layer 93 are epitaxially grown on the SiGe buffer layer thus obtained. The subsequent manufacturing steps are the same as those in the seventh embodiment.

As a modification of the present embodiment, it is also possible to form quantum dots on the gate side as in the eighth embodiment. In this case, the gate electrode is formed from $n^+$-poly-Si.

Although the typical embodiments have been disclosed and described, they may be combined suitably to provide other structures. For example, the first embodiment may be modified so as to inject carriers from the gate side. In this case, it is required that the germanium quantum dots be placed closer to the gate electrode. The embodiments described so far are based basically on a normally-off FET structure. However, by increasing the thickness of the doping layer or increasing the doping level, a normally-on structure can also be implemented for the first to fifth embodiment.

As described above, a great change in the one-dimensional channel conductance occurs depending on whether the quantum dots are charged or not. Even if, therefore, the operating voltage or read current is set lower than conventional, the discrimination between "1" and "0" states can be made with a great noise margin.

In addition, since quantum dots and quantum wire channels can be made uniform in size, variations in performance among memory cells can be made smaller than conventional even if their dimensions are scaled down. As a result of the combination of those effects, the packing density, capacity and power dissipation of semiconductor memory cell arrays can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A memory cell comprising:

a channel layer of a first semiconductor;

a spacer layer formed on the channel layer, the spacer layer comprising of a second semiconductor that is dissimilar to the first semiconductor-to form a heterojunction interface therebetween;

a V-shaped groove formed in the spacer layer, the bottom of the V-shaped groove being located above the heterojunction interface between the channel layer and the spacer layer;

a gate oxide formed in the V-shaped groove;

a plurality of quantum dots buried in the gate oxide;

a gate electrode formed on the gate oxide;

a source electrode connected to the heterojunction interface to form an ohmic contact therebetween; and a drain electrode connected to the heterojunction interface to form an ohmic contact therebetween, the drain electrode being spaced away from the source electrode so that the quantum dots are arranged therebetween.

2. The memory cell according to claim 1, wherein the first semiconductor is n-type SiGe, the second semiconductor is n-type silicon, the gate oxide is silicon oxide, and the quantum dots are made of silicon (Si).

3. The memory cell according to claim 2, wherein the gate electrode is made of $n^+$-poly-Si.

4. The memory cell according to claim 1, wherein the first semiconductor is strained p-type Si formed on relaxed p-type SiGe, the second semiconductor is relaxed p-type SiGe, the gate oxide is silicon oxide, and the quantum dots are made of silicon.

5. The memory cell according to claim 4, wherein the gate electrode is made of $n^+$-poly-Si.

* * * * *